(12) United States Patent
Baizley et al.

(10) Patent No.: US 7,685,548 B2
(45) Date of Patent: Mar. 23, 2010

(54) DETECTION METHOD FOR IDENTIFYING UNINTENTIONALLY FORWARD-BIASED DIODE DEVICES IN AN INTEGRATED CIRCUIT DEVICE DESIGN

(75) Inventors: Arnold E. Baizley, Underhill, VT (US); Joseph A. Iadanza, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 232 days.

(21) Appl. No.: 11/862,887

(22) Filed: Sep. 27, 2007

(65) Prior Publication Data

US 2009/0089724 A1 Apr. 2, 2009

(51) Int. Cl.
G06F 17/50 (2006.01)
G06F 9/45 (2006.01)

(52) U.S. Cl. ............................................. 716/5; 716/2

(58) Field of Classification Search ..................... 716/2, 716/5

See application file for complete search history.

(56) References Cited

U.S. PATENT DOCUMENTS

| | | | |
|---|---|---|---|
| 5,631,841 A | 5/1997 | Kishida et al. | |
| 6,732,340 B1 | 5/2004 | Akashi | |
| 6,941,531 B1 | 9/2005 | Teig et al. | |
| 7,188,329 B2 * | 3/2007 | Wu et al. | 716/11 |
| 2003/0237072 A1 * | 12/2003 | Melli et al. | 716/19 |
| 2004/0103384 A1 | 5/2004 | Tanaka | |
| 2004/0128631 A1 * | 7/2004 | Ditzel et al. | 716/2 |

FOREIGN PATENT DOCUMENTS

JP 1997000123962 A2 11/1998

* cited by examiner

*Primary Examiner*—Stacy A Whitmore
*Assistant Examiner*—Magid Y Dimyan
(74) *Attorney, Agent, or Firm*—Downs Rachlin Martin PLLC

(57) ABSTRACT

A detection method for identifying unintentionally forward-biased diode devices identifies one or more forward-biased diodes directly from a graphical representation of an integrated circuit (IC) device design. The graphical representation describing one or more IC components as a plurality of geometric shapes that correspond to a set of patterns in at least one semiconductor layer. A detection method may work in conjunction with one or more checks (e.g., electrical rule check (ERC)) to analyze the graphical representation and ensure its manufacturability by reducing the likelihood the forward-biased diodes will be present in the manufactured IC device.

2 Claims, 3 Drawing Sheets

US 7,685,548 B2

DETECTION METHOD FOR IDENTIFYING UNINTENTIONALLY FORWARD-BIASED DIODE DEVICES IN AN INTEGRATED CIRCUIT DEVICE DESIGN

FIELD OF THE INVENTION

The present invention generally relates to the field of integrated circuits as it relates to integrated circuit device design. In particular, the present invention is directed to a detection method for identifying unintentionally forward-biased diodes in an integrated circuit device design.

BACKGROUND

High performance integrated circuit (IC) devices include processing capabilities that require complex IC designs. While a high-level schematic of the IC device design may be developed on any available design platform, the implementation of this schematic to generate a functional layout for the IC device often results in complications that can affect the very capabilities for which the IC device has been developed. To avoid such problems, designers implement various checking tools, e.g., design rule checking (DRC) tools, to ensure the manufacturability of a layout that corresponds to these high-level schematics. In particular, a DRC tool is used to determine if an IC layout adheres to one or more of the complex technology ground rules necessary for successful production of the proposed IC device.

Although the checking tools provide some safeguards necessary for manufacturing, it is generally understood that they may not recognize unintentionally forward-biased diode devices. In general, a forward-biased diode device can occur in IC devices that include transitioning between voltage domains, self-biased P-wells and N-wells, and gate tie downs. In general, a gate tie down is intended to be a reverse-biased diode that protects the gate during manufacturing. In one example, a gate tie down is a P+ diffusion in an N-well. In another example, a gate tie down is a N+ diffusion in a P-well. However, if a P+ gate tie down diffusion is placed in an N-well that is tied to a lower voltage potential than the node driving the associated gate, then an unintentionally forward-biased diode device may result.

As mentioned above, any deficiency in the checking tools used to verify the integrity of an IC layout is significant. When translated to production layouts and eventual manufactured devices, most IC devices require complicated schematic layouts that result in forward-biased and parasitic diode devices unintentionally forming. Accordingly, to truly ascertain whether an IC device will function properly, designers should implement additional methods to verify the quality of the IC device design. Most of the methods employed, however, require a comprehensive suite of input patterns and other manually meticulous diagnostic schemes that are susceptible to, e.g., human error. Moreover, even if a designer develops a truly exhaustive method, the time required to verify a complicated IC design is very prohibitive. For these reasons, designers and manufacturers of IC devices would welcome a method that improves the likelihood of identifying forward-biased diodes, reduces the manual interaction of the designer, and enhances the productivity associated with implementing checking tools.

SUMMARY OF THE DISCLOSURE

In one embodiment, a computer-implemented method of inspecting an integrated circuit (IC) device design, the IC device design including one or more circuit nodes that describe an electrical signal, the method comprising providing a graphical representation of an IC device design, the graphical representation describing one or more IC components as a plurality of geometric shapes that correspond to a set of patterns in at least one semiconductor layer; identifying directly from the graphical representation one or more IC components that correspond to a potential forward-biased diode device as a function of a threshold value; and outputting an indicia of the potential forward-biased diode devices.

In another embodiment, a computer-implemented method of detecting potential forward-biased diode devices in an IC device design, the IC device design being described by a graphical representation having a plurality of geometric shapes that correspond to a set of patterns in at least one semiconductor layer, the method includes simplifying the graphical representation as a function of an input file, wherein said simplifying includes removing from consideration one or more IC components that correspond to at least one circuit node not listed in the input file; selecting from the graphical representation one or more IC components that correspond to an anode diffusion in communication with a cathode diffusion for each circuit node remaining in the graphical representation; removing from the selected IC components one or more IC components having geometric shapes that are inconsistent with a potential forward-biased diode device; naming from the remaining IC components one or more IC components so as to cause each anode diffusion and each cathode diffusion in the graphical representation to correspond with one or more circuit nodes; selecting from the named IC components one or more IC components that correspond to a potential forward-biased diode device as a function of a threshold value; and outputting an indicia of the potential forward-biased diodes.

In still another embodiment, a machine-readable medium containing machine-readable instructions for performing a computer-implemented method of checking an integrated circuit device design having a plurality of diodes, including a set of instructions for providing a graphical representation of an IC device design, the graphical representation describing one or more IC components as a plurality of geometric shapes that correspond to a set of patterns in at least one semiconductor layer; a set of instructions for identifying directly from the graphical representation one or more IC components that correspond to a potential forward-biased diode device as a function of a threshold value; and a set of instructions for outputting an indicia of the potential forward-biased diode devices.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

DETAILED DESCRIPTION

A computer-implemented detection method for identifying forward-biased diode devices may reduce the number of unintentionally forward-biased diodes from among a plurality of diode devices in a integrated circuit (IC) device design. Such a detection method may reduce complications in the resultant IC device by recognizing potential forward-biased diode devices prior to manufacturing. Moreover, without the need of a netlist, a detection method identifies potentially problematic diode devices directly from a graphical representation of the physical layout of IC components of an IC device design (i.e., the IC layout file).

Figure 1:
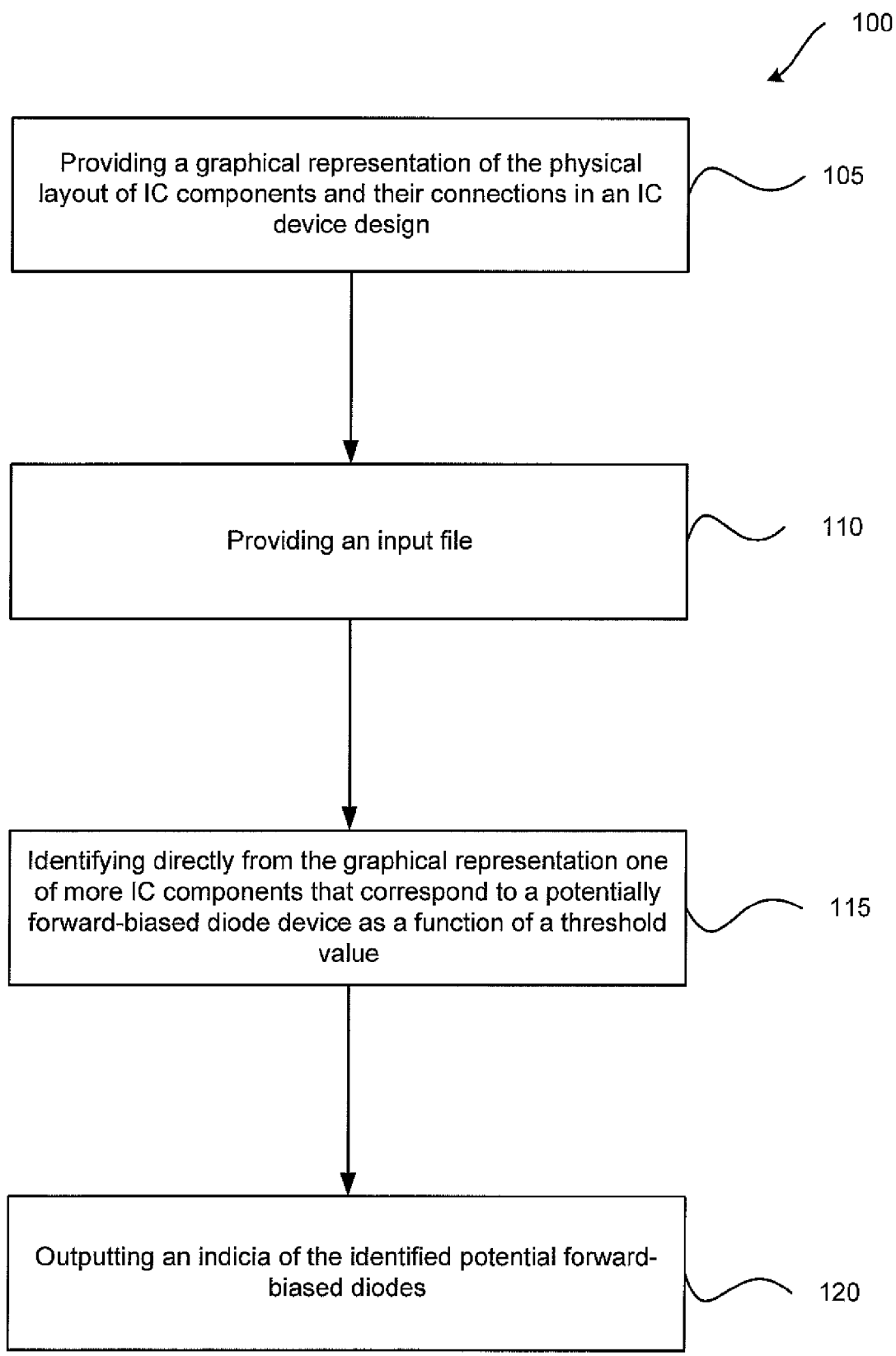
FIG. 1 illustrates a schematic flow diagram of an embodiment of a computer-implemented detection method for identifying unintentionally forward-biased diode devices in an integrated circuit design.

FIG. 1 illustrates one embodiment of a computer-implemented detection method 100 for identifying unintentionally forward-biased diode devices. Method 100 includes, at stage 105, providing a graphical representation of the physical layout of IC components, and their connections, in an IC device design. A graphical representation, such as, for example, an IC layout file, includes one or more geometric shapes that correspond to a set of patterns in at least one semiconductor layer. In one example, a graphical representation is an IC layout file having a GDS II database file format. A GDS II file format includes one or more geometric shapes, one or more text labels, and other graphical information for describing an IC device design in a hierarchical form. A GDS II file format is well-known in the art as an IC layout file format and the graphical representation of an IC device that corresponds thereto. Although the GDS II file format is discussed primarily herein with respect to the various embodiments of the present disclosure, it is readily appreciated that a detection method (e.g., detection method 100) in accordance with the present disclosure will work with other known or developing IC layout file formats used to describe a graphical representation of an IC device design.

A graphical representation may include one or more diode devices. A diode device is a solid-state IC device component having a cathode diffusion and an anode diffusion separated by a depletion zone. In semiconductor devices, a diode device is formed by combining P-type and N-type semiconductors. The combination forms an electrically conductive device well-known in the art. The diode device has a built-in voltage potential created by the interaction and physical characteristics of the P-type and N-type semiconductors. When no voltage is applied to the diode device, a dynamic equilibrium prevents the device from conducting electric current.

Applying a voltage to the diode device may alter its dynamic equilibrium. In one example, a diode device becomes forward-biased when a voltage having a polarity opposite of the built-in voltage potential described above is applied. In another example, a diode device becomes reverse-based when a voltage having a polarity that is the same as the built-in voltage potential is applied. Since IC designers use the variable characteristics of diode devices in integrated circuits to direct current through an IC circuit and isolate various signals in related devices, it is important that the functionality intended by a designer in a high-level schematic diagram is translated to the IC layout used in the manufacturing stages of an IC device.

Referring back to FIG. 1, at stage 110, computer-implemented detection method 100 optionally includes providing an input file. An input file is a computer-implemented file having information, data and/or other user preferred information consistent with the evaluation of the graphical representation of an IC device design. In one implementation of detection method 100, an input file may include information that corresponds to the graphical representation. For example, an input file may include values that may be utilized in the identifying of potentially forward-biased diode devices from among the diode devices in a graphical representation of the IC device design.

As described above, a graphical representation may include one or more IC components connected to one or more circuit nodes. Examples of a circuit node include, but are not limited to, a global power source (VDD), an analog power source (AVDD), a ground (GND), an input signal, a reference number (REF #), and any combination thereof. In one implementation of detection method 100, an input file includes a signal voltage table. A signal voltage table provides circuit node values for the circuit nodes, such as, without limitation, VDD, AVDD, and GND. Table 1 illustrates an exemplary signal voltage table defining voltages for each of the circuit nodes in an exemplary graphical representation:

TABLE 1

| Node | Volts (V) | | |
|---|---|---|---|
| | MIN | NOM | MAX |
| GND | −0.20 | 0.00 | 0.20 |
| AGND | −0.20 | 0.00 | 0.20 |
| VDD | 0.00 | 1.05 | 1.30 |
| AVDD | 2.25 | 2.50 | 2.75 |
| VCC | 1.10 | 1.20 | 1.30 |

As illustrated in Table 1 above, an example of a signal voltage table includes one or more values for each of the identified circuit nodes. It is contemplated that a signal voltage table does not need to include all of the circuit nodes. In the present example, the signal voltage table includes the minimum (MIN) value, the maximum (MAX) value, and the nominal (NOM) voltage value for at least a subset of the circuit nodes found in a graphical representation. In another example, the signal voltage table includes only the nominal, minimum or maximum voltages which may be applied to a circuit node. In still another example, only the power supply nodes of the circuit are included. In yet another example, the power supply nodes and the input signal nodes to the circuit are included. As will be discussed more below, an embodiment of a detection method uses the voltage values present in a signal voltage table to identify potentially forward-biased diode devices.

In another implementation of detection method 100, an input file includes a threshold value. Examples of a threshold value include, but are not limited to, a designer-selected forward bias sensitivity (FBS) value, a device-specific FBS value, a technology-driven forward-biased diode FBS value, and any combinations thereof. In one example, an FBS value has a value equal to about 700 mV. In another example, an FBS value has a value from about 200 mV to about 300 mV.

Optionally, certain implementations of detection method 100 do not require an input file. In one example, a detection method includes a set of globally-defined circuit nodes. Each of the globally-defined circuit nodes includes a corresponding globally-defined threshold value. A global threshold value is a value that is used to verify all of the circuit nodes. All circuits in an IC layout are compared to the global threshold values for each of the circuit nodes in a signal voltage table (e.g., circuit nodes AVDD, GND, VDD, VCC, AGND in Table 1).

At stage 115, computer-implemented detection method 100 includes identifying directly from the graphical representation one or more IC components that correspond to a potentially forward-biased diode device as a function of a threshold value. A detection method may enhance one or more checks known in the art. A check is an analysis tool that includes a series of established design rules used to verify the manufacturability of an IC device design. Examples of checks include, but are not limited to, an electrical rule check (ERC), a layout-vs.-schematic (LVS) check, a design rule check (DRC), an XOR check, an Antenna check, and any combinations thereof. In one implementation, a detection method (e.g., detection method 100) includes instructions so as to cause the check to locate IC components that correspond to a potential forward-biased diode device directly from the graphical representation of the IC device design.

In another implementation, a detection method (e.g., detection method 100) may work in conjunction with one or more of these checks to analyze a graphical representation of an IC device design to ensure its manufacturability by reducing the likelihood of forward-biased diodes. In one example, detection method 100 utilizes an ERC, such as, for example, an ERC developed with the Hercules Physical Verification Suite distributed by Synopsis of Mountain View, Calif. The ERC may be utilized during the identification of one or more potentially forward-biased diode devices directly from a graphical representation of the IC device design. In one example, the ERC may be used in the identification of a forward-biased diode device in communication with a circuit node that exceeds a threshold value.

Referring back to FIG. 1, at stage 120, method 100 includes outputting an indicia of the identified potential forward-biased diode devices. An indicia is a representation or other presentation of the identified diode devices. Examples of an indicia include, but are not limited to, a graph, a table, a list, a collection of marker shapes, a machine-readable collection of coordinates, and any combinations thereof. An indicia can be output to a variety of different places. In one example, outputting an indicia representing the identified diodes can occur on a computer-related peripheral device. A variety of peripheral output devices are discussed below with respect to FIG. 3 and an exemplary machine environment for implementation of any one or more of the aspects and/or embodiments disclosed herein. In one example, a computer-related peripheral is a display device (e.g., a computer monitor). In another example, a computer-related peripheral is a PDA. In still another example, outputting an indicia representing identified forward-biased diode devices can occur via a network connection so as to cause the identified diode devices to output in a different computer-related application, e.g., a design tool used to create an IC design.

In view of the foregoing, an exemplary implementation of a detection method detects potential forward-biased diodes directly from a graphical representation of an IC device design, instead of a netlist. Using a hierarchical graphical representation of an IC device layout, one embodiment of a detection method may boost productivity, may improve efficiency, and may increase the amount of data that can be checked. As will be described in more detail below, an embodiment of a detection method may also identify one or more power-sequencing-sensitive (PSS) forward-biased diode devices.

Figure 2:
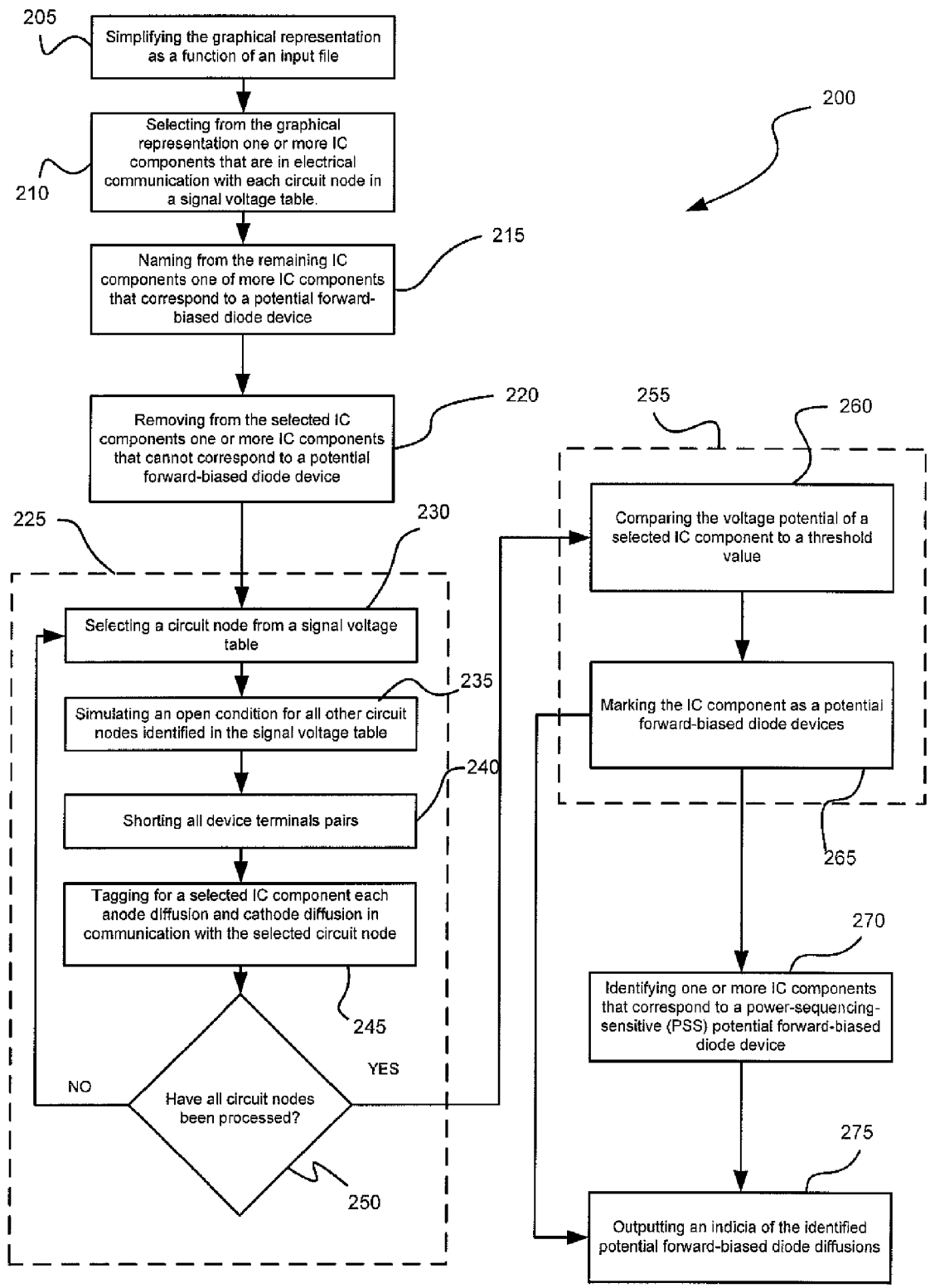
FIG. 2 illustrates another embodiment of a computer-implemented detection method for identifying unintentionally forward-biased diode devices in an integrated circuit design.

FIG. 2 illustrates another embodiment of a computer-implemented detection method 200 for identifying unintentionally forward-biased diode devices in an IC device design. At stage 205, detection method 200 includes simplifying the graphical representation of an IC device design as a function of an input file. This design information may include a signal voltage table (e.g., Table 1 above) that defines one or more circuit nodes. In one implementation, detection method 200 identifies one or more IC components in the graphical representation that are not in communication with one or more circuit nodes defined in the input file. In another implementation, detection method 200 identifies one or more IC components in the graphical representation that are not identified in the input file. The identified IC component will not be analyzed in accordance with the steps below.

At stage 210, detection method 200 includes selecting from the graphical representation one or more IC components having geometric shapes, labels and identifying attributes that are in electrical communication with each circuit node in a signal voltage table. As discussed above, a graphical representation includes one or more geometric shapes that correspond to a set of patterns in at least one semiconductor layer. An identifying attribute describes the location of a geometric shape. In one implementation of a detection method, an identifying attribute describes the semiconductor layer(s) where a geometric shape is located during manufacturing. Examples of an identifying attributes include, but are not limited to, a layer number, a data type, a text type, a layer name, and any combinations thereof.

Those ordinarily skilled in the art will appreciate these identifying attributes as they relate to integrated circuits and integrated circuit manufacturing practices. Moreover, those ordinarily skilled in the art will understand the relationship between geometric shapes, as well as the position of these geometric shapes corresponding to a graphical representation and an IC device design. In one example, a first set of geometric shapes corresponds to circuit node GND labels and attributes is identified along with a second set to circuit node AGND, a third set to circuit node VDD, a fourth set to circuit node AGND, and a fifth set to circuit node VCC. In another example, correspondence is determined for each circuit node in an input file and a set of geometric shapes that directly contact the circuit node in the graphic representation.

At stage 215, detection method 200 includes naming from the remaining IC components one or more IC components that correspond to a potential forward-biased diode device. It is appreciated that one ordinarily skilled in the art would understand the relationship between shapes on various IC manufacturing levels which together define various IC devices including diode devices. In certain implementations, a detection method 200 identifies all diode devices present in the IC device without regard to anode or cathode connectivity.

Optionally, at stage 220, detection method 200 may include identifying IC components that do not correspond to a potential forward-biased diode device prior to full analysis of the graphical representation. It is recognized that certain IC components are arranged within an IC device design in a manner that prevents them from ever becoming forward-biased. Examples of such arrangement include, but are not limited to, an anode diffusion in direct connection with a circuit node having the lowest voltage amongst all circuit nodes in a design; a circuit node with the with the lowest continuity available amongst all circuit nodes; an IC component having a direct connection between an anode diffusion and a cathode diffusion; and other arrangements common in the art.

Detection method 200 may, at step 220, remove such IC components from further consideration. In one example, values of operation of the IC device represented by the IC design that are stored in the input file may be used in this determination. At stage 225, detection method 200 includes identifying one or more of the IC components so as to associate each anode diffusion and each cathode diffusion with one or more circuit nodes. As mentioned above, potential voltage values for the circuit nodes may be defined in a signal voltage table. These voltage values may be used to differentiate amongst the one or more IC components in the graphical representation.

In the present implementation, detection method 200 iteratively addresses each of the IC components in a graphical representation of an IC device design. Here, detection method 200 includes, at stage 230, selecting a circuit node for analysis from a signal voltage table. Although discussed in terms of an iterative process, it is contemplated that a detection method (e.g., detection method 200) can include steps to evaluate serially, or otherwise, the circuit nodes of a graphical representation of an IC device design. At stage 235, detection method 200 includes simulating an open condition for all other circuit nodes identified in the signal voltage table. In other implementations of detection method 200, geometric shapes that correspond with the circuit nodes (i.e., having names as discussed in stage 210 above) that are not selected are removed temporarily from the graphical representation. It is contemplated that removing certain geometric shapes prevents shorting, as discussed in connection with stage 240 below.

At stage 240, detection method 200 includes shorting all device terminal pairs having low impedance or low potential difference between the devices during operation of the IC device. A detection method (e.g., detection method 200) that shorts all device terminals may emulate a worst case environment for the circuits, devices and potentially forward-biased diode devices involved. In one example, detection method 200 allows propagation of circuit node voltages through designated IC components without degradation.

If a device terminal pair cannot be placed in a low impedance state, then certain implementations of detection method 200 simulate these device terminal pairs as opens, similar to those circuit nodes discussed in connection with stage 235 above. In one example, Table 2 below illustrates the computer-implemented commands and operations that correspond to the one or more instructions for simulating a condition for various IC components found in a graphical representation of an IC device design.

TABLE 2

| IC components | Operation |
| --- | --- |
| Resistor | Short Terminals |
| | Short source and drain terminal together |
| Transistor | Open Gate—Source Connection |
| | Open Gate—Drain Connection |
| | Short Collector—Base (Single Direction) |
| PNP Bipolar | Short Emitter—Base (Single Direction) |
| | Open Base—Emitter (Single Direction) |
| Inductor | Short Terminals |
| Capacitor | Open Terminals |

Those skilled in the art will readily appreciate the extension of exemplary handling of devices in Table 2 to various other devices and technologies.

At stage 245, detection method 200 includes tagging with an identifier for a selected IC component, each of the anode diffusion and cathode diffusion in communication with the circuit node selected at stage 230. Examples of an identifier include, but are not limited to, a circuit node name, a circuit node number, a shape on a marking layer corresponding the selected circuit node, and any combination thereof. In certain implementations of detection method 200, the communication between an anode diffusion or cathode diffusion and a circuit node may be provided by a direct connection. In other implementations of detection method 200, communication between an anode diffusion or cathode diffusion and a circuit node may be provided by device connections according to stage 235.

At stage 250, detection method 200 includes determining if all circuit nodes in a design have been processed according to stage 225. Here, detection method 200 may compare the already identified circuit nodes with the signal voltage table (or equivalent). If all circuit nodes have not been processed, then detection method 200 returns to stage 230, where method 200 selects a different circuit node.

At stage 255, detection method 200 includes identifying the IC components that correspond to a potential forward-biased diode device as a function of a threshold value. At a high level, a potential forward-biased diode device is a diode device having a voltage potential (i.e., a voltage difference from the anode to the cathode) that is positive and greater than a threshold value, such as the FBS threshold value discussed above. In one example, at stage 260, detection method 200 includes comparing the voltage potential for a selected IC component to the threshold value. If the voltage potential is positive and greater than the threshold value, then at stage 265, detection method 200 includes marking the IC component as a potential forward-biased diode device. In another example, detection method 200 compares the voltage potential for a set of circuit nodes connectable to an anode diffusion and a set of circuit nodes connectable to a cathode diffusion for one or more forward-biased diode node pairs (FBNPs). An FBNP is a combination of an anode diffusion and a cathode diffusion having a potential difference greater than the threshold value. In one example, the potential difference is determined from a signal voltage table or equivalent source.

Optionally, at stage 270, detection method 200 includes identifying one or more IC components that correspond to a power-sequencing-sensitive (PSS) potential forward-biased diode device. A PSS potential forward-biased diode device is a diode device that exists only when one or more nodes as defined in the signal voltage table (or equivalent) are not powered to their designated voltage value, e.g., they are powered down or at ground potential. In one implementation, detection method 200 includes, at stage 270, identifying one or more IC components that correspond to PSS potential forward-biased diode devices as a function of one or more power sequencing criteria. A power sequencing criteria is the combination of one or more circuit node values used to determine which of the IC components may be a PSS forward-biased diode device. In one example, a power sequencing criteria includes selecting a node in the table for analysis while setting all non-selected nodes to a single value (e.g., zero) to determine if forward-biased diode devices exist when only the selected circuit node is powered. Power supply sequence independence is checked by applying the circuit node analysis method on each node in the table. In another example, a power sequencing criteria includes comparing the set of circuit nodes connectable to an anode diffusion of a diode device to the set of circuit nodes having a voltage potential sufficient to meet the FBS when the cathode diffusion is assumed to be ground or zero volts.

At stage 275, method 200 includes outputting an indicia of the identified potential forward-biased diode devices. As discussed above, an indicia is a representation or other presentation of the identified diode devices. Examples of an indicia include, but are not limited to, a graph, a table, a list, a plot, a computer-readable file, and any combination thereof.

It is to be noted that the aspects and embodiments described herein may be conveniently implemented using one or more machines (e.g., a computing device) programmed according to the teachings of the present specification, as will be apparent to those of ordinary skill in the computer art. For example, various aspects of a detection method for identifying unintentional forward-biased diodes in an integrated circuit design as described herein, may be implemented as machine-executable instructions (i.e., software coding), such as program modules executed by one or more machines. Typically a program module may include routines, programs, objects, components, data structures, etc. that perform specific tasks. Appropriate machine-executable instructions can readily be prepared by skilled programmers based on the teachings of the present disclosure, as will be apparent to those of ordinary skill in the software art.

Such software may be a computer program product that employs a machine-readable medium. Example computer programs include, but are not limited to, an operating system, a browser application, a micro-browser application, a proxy application, a business application, a server application, an email application, an online service application, an interactive television client application, an ISP client application, a gateway application, a tunneling application, and any combinations thereof. A machine-readable medium may be any medium that is capable of storing and/or encoding a sequence of instructions for execution by a machine (e.g., a computing device) and that causes the machine to perform any one of the methodologies and/or embodiments described herein. Examples of a machine-readable medium include, but are not limited to, a magnetic disk (e.g., a conventional floppy disk, a hard drive disk), an optical disk (e.g., a compact disk "CD", such as a readable, writeable, and/or re-writable CD; a digital video disk "DVD", such as a readable, writeable, and/or rewritable DVD), a magneto-optical disk, a read-only memory "ROM" device, a random access memory "RAM" device, a magnetic card, an optical card, a solid-state memory device (e.g., a flash memory), an EPROM, an EEPROM, and any combinations thereof. A machine-readable medium, as used herein, is intended to include a single medium as well as a collection of physically separate media, such as, for example, a collection of compact disks or one or more hard disk drives in combination with a computer memory.

Examples of a computing device include, but are not limited to, a general purpose computer; a special purpose computer; a computer workstation; a terminal computer; a notebook/laptop computer; a server computer; a handheld device (e.g., tablet computer, a personal digital assistant "PDA", a mobile telephone, etc.); a web appliance; a network router; a network switch; a network bridge; a set-top box "STB;" video tape recorder "VTR;" a digital video recorder "DVR;" a digital video disc "DVD" device (e.g., a DVD recorder, a DVD reader); any machine, component, tool, equipment capable of executing a sequence of instructions that specify an action to be taken by that machine, and any combinations thereof. In one example, a computing device may include and/or be included in, a kiosk. In another example, a computing device includes a mobile device. In yet another example, a computing device includes a device configured for display of video and/or audio content accessed over a network.

Figure 3:
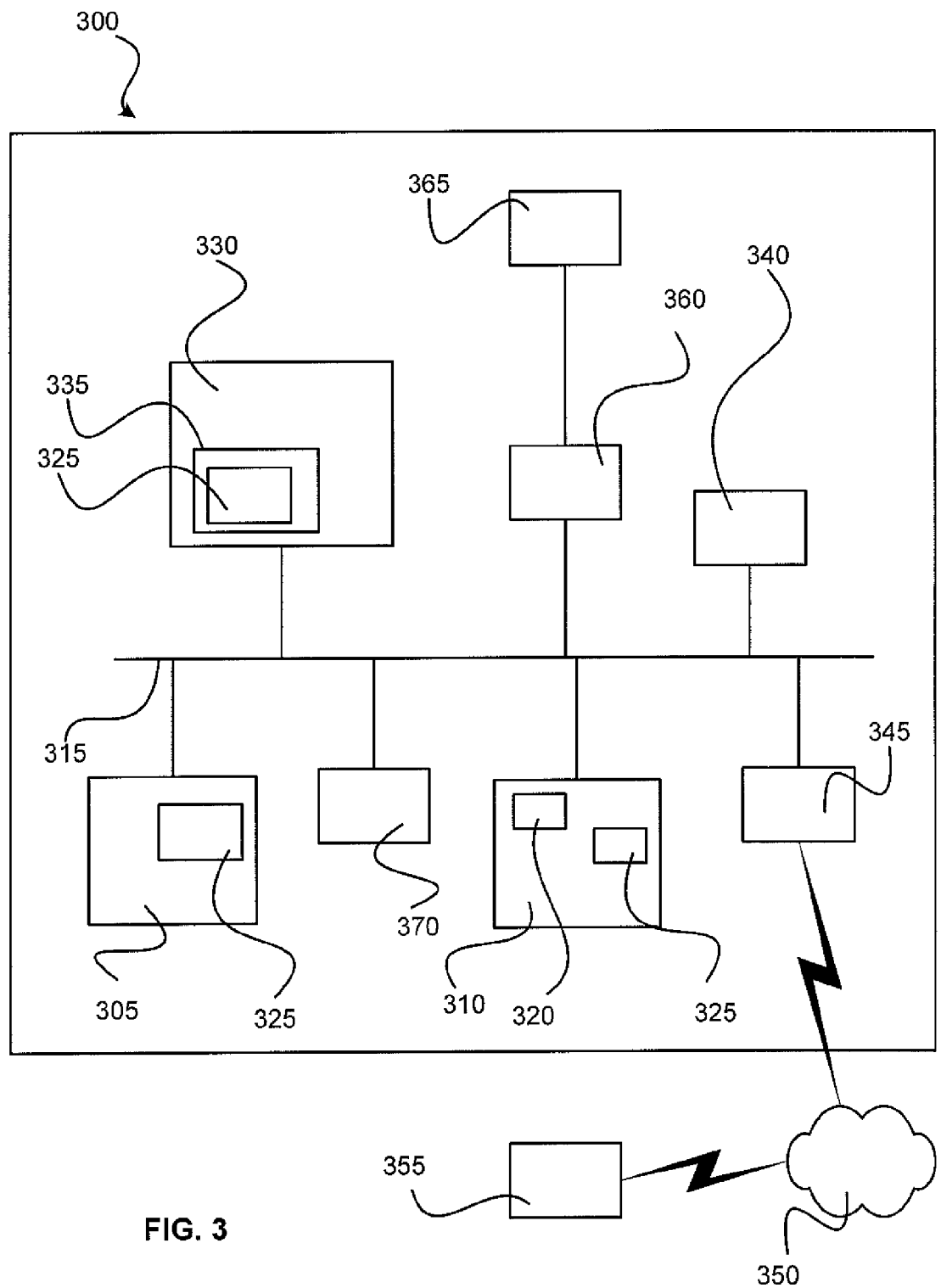
FIG. 3 illustrates a schematic diagrammatic representation of an embodiment of a machine for implementing a set of instructions for performing one or more aspects of a detection method for identifying unintentionally forward-biased diode devices in an integrated circuit design.

FIG. 3 shows a diagrammatic representation of one embodiment of a machine in the exemplary form of a computer system 300 within which a set of instructions for causing the computing device to perform any one or more of the aspects and/or methodologies of the present disclosure may be executed. It should be noted that although computer system 300 itself and its components may be shown as singular entities, each component and computer system 300 may include any number of components configured to perform a certain functionality. For example, multiple computer systems 300 may combine to perform any one or more of the aspects and/or methodologies of the present disclosure. Additionally any one aspect and/or methodology of the present disclosure may be dispersed across any number of computer system 300 or across any number of computer system components.

Computer system 300 includes a processor 305 and a memory 310 that communicate with each other, and with other components, via a bus 315. Bus 315 may include any of several types of bus structures including, but not limited to, a memory bus, a memory controller, a peripheral bus, a local bus, and any combinations thereof, using any of a variety of bus architectures.

Memory 310 may include various components (e.g., machine readable media) including, but not limited to, a random access memory component (e.g., a static RAM "SRAM", a dynamic RAM "DRAM", etc.), a read only component, and any combinations thereof. In one example, a basic input/output system 320 (BIOS), including basic routines that help to transfer information between elements within computer system 300, such as during start-up, may be stored in memory 310. Memory 310 may also include (e.g., stored on one or more machine-readable media) instructions (e.g., software) 325 embodying any one or more of the aspects and/or methodologies of the present disclosure. In another example, memory 310 may further include any number of program modules including, but not limited to, an operating system, one or more application programs, other program modules, program data, and any combinations thereof.

Computer system 300 may also include a storage device 330. Examples of a storage device (e.g., storage device 330) include, but are not limited to, a hard disk drive for reading from and/or writing to a hard disk, a magnetic disk drive for reading from and/or writing to a removable magnetic disk, an optical disk drive for reading from and/or writing to an optical media (e.g., a CD, a DVD, etc.), a solid-state memory device, and any combinations thereof. Storage device 330 may be connected to bus 315 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 330 may be removably interfaced with computer system 300 (e.g., via an external port connector (not shown)). Particularly, storage device 330 and an associated machine-readable medium 335 may provide nonvolatile and/or volatile storage of machine-readable instructions, data structures, program modules, and/or other data for computer system 300. In one example, software 325 may reside, completely or partially, within machine-readable medium 335. In another example, software 325 may reside, completely or partially, within processor 305.

Computer system 300 may also include an input device 340. In one example, a user of computer system 300 may enter commands and/or other information into computer system 300 via input device 340. For example, a user may utilize a computing device with an input device, such as input device 340 to enter information corresponding to a shape and/or one or more mesh parameters. Examples of an input device 340 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), touchscreen, and any combinations thereof. Input device 340 may be interfaced to bus 315 via any of a variety of interfaces (not shown) including, but not limited to, a serial interface, a parallel interface, a game port, a USB interface, a FIREWIRE interface, a direct interface to bus 315, and any combinations thereof.

A user may also input commands and/or other information to computer system 300 via storage device 330 (e.g., a removable disk drive, a flash drive, etc.) and/or a network interface device 345. A network interface device, such as network interface device 345 may be utilized for connecting computer system 300 to one or more of a variety of networks, such as network 350, and one or more remote computing devices 355 connected thereto. Examples of a network interface device include, but are not limited to, a network interface card, a modem, and any combination thereof. A network may include one or more elements configured to communicate data (e.g., direct data, deliver data). Examples of a network element include, but are not limited to, a router, a server, a switch, a proxy server, an adapter, an intermediate node, a wired data pathway, a wireless data pathway, and any combinations thereof. Examples of a network or network segment include, but are not limited to, a wide area network (e.g., the Internet, an enterprise network), a local area network (e.g., a network associated with an office, a building, a campus or other relatively small geographic space), a telephone network, a direct connection between two computing devices, and any combinations thereof. A network, such as network 350, may employ a wired and/or a wireless mode of communication. Various communication protocols (e.g., HTTP, WAP, TCP/IP) and/or encripytion protocols (e.g., UDP) may be utilized in connecting and/or for communication over a network, such as network 350. In general, any network topology may be used. Information (e.g., data, software 325, etc.) may be communicated to and/or from computer system 300 via network interface device 345. In yet another example, storage device 330 may be connected to bus 315 via network interface 345. In still another example, input device 340 may be connected to bus 315 via network interface 345.

Computer system 300 may further include a video display adapter 360 for communicating a displayable image to a display device, such as display device 365. For example, video display adapter 360 may be utilized to display an interface for accessing one or more content items over a network to display device 365. Examples of a display device include, but are not limited to, a liquid crystal display (LCD), a cathode ray tube (CRT), a plasma display, and any combinations thereof. In addition to a display device, a computer system 300 may include one or more other peripheral output devices including, but not limited to, an audio speaker, a printer, and any combinations thereof. Such peripheral output devices may be connected to bus 315 via a peripheral interface 370. Examples of a peripheral interface include, but are not limited to, a serial port, a USB connection, a FIREWIRE connection, a parallel connection, and any combinations thereof.

A digitizer (not shown) and an accompanying pen/stylus, if needed, may be included in order to digitally capture freehand input. A pen digitizer may be separately configured or coextensive with a display area of display device 365. Accordingly, a digitizer may be integrated with display device 365, or may exist as a separate device overlaying or otherwise appended to display device 365.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A computer-implemented method of detecting potential forward-biased diode devices in an IC device design, the IC device design being described by a graphical representation having a plurality of geometric shapes including one or more geometric shapes each corresponding to an IC component and a plurality of geometric shapes each corresponding to a circuit node, the method comprising:

simplifying the graphical representation as a function of a subset of said plurality of geometric shapes corresponding to a circuit node;

selecting from the graphical representation one or more IC components that correspond to an anode diffusion in communication with a cathode diffusion for each circuit node remaining in the graphical representation;

removing from the selected IC components one or more IC components having geometric shapes that are inconsistent with a potential forward-biased diode device the potential forward-biased diode device is a diode device having a voltage potential that is positive and greater than a threshold value;

naming from the remaining IC components one or more IC components so as to cause each anode diffusion and each cathode diffusion in the graphical representation to correspond with one or more circuit nodes;

selecting from the named IC components one or more IC components that correspond to a potential forward-biased diode device as a function of a threshold value, said selecting including identifying from the named IC components one or more IC components that correspond to a power-sequencing-sensitive (PSS) potential forward-biased diode device as a function of a combination of one or more circuit node values associated with the named IC components; and outputting an indicia of the potential forward-biased diodes.

2. A computer-implemented method according to claim 1, further comprising receiving an input file, the input file includes one or more of a signal voltage table, a threshold value, a power sequencing criteria, and any combinations thereof.

* * * * *